United States Patent
Xiang et al.

(10) Patent No.: US 7,952,423 B2
(45) Date of Patent: May 31, 2011

(54) PROCESS/DESIGN METHODOLOGY TO ENABLE HIGH PERFORMANCE LOGIC AND ANALOG CIRCUITS USING A SINGLE PROCESS

(75) Inventors: Qi Xiang, San Jose, CA (US); Albert Ratnakumar, San Jose, CA (US); Jeffrey Xiaoqi Tung, Milpitas, CA (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/241,706

(22) Filed: Sep. 30, 2008

(65) Prior Publication Data

US 2010/0079200 A1    Apr. 1, 2010

(51) Int. Cl.
G05F 1/10 (2006.01)

(52) U.S. Cl. .......................... 327/535; 327/534

(58) Field of Classification Search .................. 327/534, 327/535, 537
See application file for complete search history.

(56) References Cited

U.S. PATENT DOCUMENTS

| | | | | |
|---|---|---|---|---|
| 5,834,966 A * | 11/1998 | So et al. | | 327/534 |
| 5,883,544 A * | 3/1999 | So et al. | | 327/537 |
| 6,097,113 A * | 8/2000 | Teraoka et al. | | 307/125 |
| 6,160,432 A | 12/2000 | Rhee et al. | | |
| 6,614,301 B2 * | 9/2003 | Casper et al. | | 330/253 |
| 6,680,650 B2 * | 1/2004 | Gupta | | 330/277 |
| 6,743,684 B2 * | 6/2004 | Liu | | 438/300 |
| 6,784,722 B2 * | 8/2004 | Tang et al. | | 327/534 |
| 6,867,637 B2 * | 3/2005 | Miyazaki et al. | | 327/534 |
| 7,064,039 B2 * | 6/2006 | Liu | | 438/300 |
| 7,129,871 B1 | 10/2006 | Venes et al. | | |
| 7,164,307 B2 * | 1/2007 | Tschanz et al. | | 327/534 |
| 7,199,430 B2 * | 4/2007 | Babcock et al. | | 257/368 |
| 7,508,251 B2 * | 3/2009 | Sumita et al. | | 327/534 |
| 7,525,381 B2 * | 4/2009 | Murden et al. | | 330/261 |
| 7,573,317 B2 * | 8/2009 | Lewis et al. | | 327/534 |
| 7,612,604 B2 * | 11/2009 | Miyazaki et al. | | 327/534 |
| 7,675,317 B2 * | 3/2010 | Perisetty | | 326/38 |
| 2006/0065937 A1 * | 3/2006 | Hoffmann et al. | | 257/401 |
| 2006/0066388 A1 * | 3/2006 | Tschanz et al. | | 327/534 |
| 2006/0186957 A1 | 8/2006 | Mattison | | |

* cited by examiner

Primary Examiner — Thomas J Hiltunen
(74) Attorney, Agent, or Firm — Martine Penilla & Gencarella, LLP

(57) ABSTRACT

A method for improving analog circuits performance using a circuit design using forward bias and a modified mixed-signal process is presented. A circuit consisting plurality of NMOS and PMOS transistors is defined. The body terminal of the NMOS transistors are coupled to a first voltage source and the body terminal of the PMOS transistors are coupled a second voltage source. Transistors in the circuit are selectively biased by applying the first voltage source to the body terminal of each selected NMOS transistor and applying the second voltage source to the body terminal of each selected PMOS transistor. In one embodiment, the first voltage source and the second voltage source are modifiable to provide forward and reverse bias to the body terminal of the transistors.

18 Claims, 5 Drawing Sheets

PROCESS/DESIGN METHODOLOGY TO ENABLE HIGH PERFORMANCE LOGIC AND ANALOG CIRCUITS USING A SINGLE PROCESS

BACKGROUND OF THE INVENTION

Current trends in complementary metal oxide semiconductor (CMOS) technology have led to improved digital circuit performance often at the expense of analog circuit performance. The difficulty of designing high performance analog circuits is clearly apparent when designing mixed signal products fabricated using a logic-based advanced process. State-of-art transistors optimized for digital applications use super halo (or pocket) implants to control short channel effects. Some effects of using super halo implants are increasing transistor threshold voltage mismatch, as well as increased output conductance, which both of which degrade analog circuit performance. In addition, several high performance analog circuits, such as cascode-based charge pumps and current mirrors, require very low threshold voltages for proper performance. As CMOS technology continues to advance, halo doses are expected to continue to increase, further exacerbating the difficulties of maintaining usable analog circuit performance.

In large part, analog circuit performance degradation is caused by transistor threshold voltage mismatch and high output conductance in advanced CMOS technologies. The gate of a transistor controls the channel charge with only a relatively minor portion of the channel charge controlled by the drain. The threshold voltage of a transistor is mainly determined by the gate controlled portion of the channel charge. The channel charge controlled by the drain becomes more significant when the doping of the drain of the transistor is very high relative to the doping of the channel. In addition, the random doping fluctuation of the well will affect the drain depletion region, which is a more significant effect in a lightly doped channel. High output conductance in current CMOS technology is a result of a large difference in doping levels between pocket and channel doping. A large imbalance of relative doping between the pocket implant doping level and the channel doping level leads to a reduction of the output conductance, especially for long channel devices. The high pocket implant doping level relative to the channel doping level causes saturation of the drain current at a lower drain bias in regions of the transistor with the pocket doping level compared to regions of the transistor with the channel doping level.

As a result, there is a need to solve the problems of the prior art to provide a method and apparatus for improving analog circuit performance in mixed signal processes.

SUMMARY OF THE INVENTION

Broadly speaking, the present invention fills these needs by providing a method and apparatus for enabling high performance analog circuits on a mixed-signal CMOS process. It should be appreciated that the present invention can be implemented in numerous ways, including as a method, a system, or a device. Several inventive embodiments of the present invention are described below.

In accordance with one aspect of the invention, a method for increasing gate overdrive headroom for analog circuits is detailed. A circuit consisting of a plurality of NMOS and PMOS transistors is defined. The body terminal of the NMOS transistors are coupled to a first voltage source and the body terminal of the PMOS transistors are coupled to a second voltage source. Transistors in the circuit are selectively biased by applying the first voltage source to the body terminal of each selected NMOS transistor and applying the second voltage source to the body terminal of each selected PMOS transistor. In one embodiment, the first voltage source and the second voltage source are modifiable to provide forward and reverse bias to the body terminal of the transistors. Also, the circuit can be disabled through application of a reverse bias when the circuit is not needed. In another embodiment, the transistor threshold voltage mismatch is compensated in selected transistors using forward bias. In yet another embodiment, the channel of each of the transistors is doped with a doped retrograde well.

In accordance with another aspect of the invention, a circuit for decreasing output conductance and transistor mismatch is detailed. The circuit includes a plurality of transistors of NMOS and PMOS transistors is defined. A first voltage source is selectively coupled to the body terminal of each of the set of NMOS transistors and a second voltage source is selectively coupled to a body terminal of each of the set of PMOS transistors. The first voltage source and the second voltage source are modifiable to provide either forward or reverse bias. In one embodiment, the circuit has modifiable voltage source logic to select transistors from the set of NMOS transistors and PMOS transistors for application of the first voltage source and the second voltage source, respectively, to the body terminal of the selected transistors. The voltage source logic is also capable of modifying voltage levels of the first voltage source and the second voltage source. In another embodiment, the channel of each of the plurality of transistors in the circuit has a doped retrograde well.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION

The following embodiments describe an apparatus and method for enabling high performance analog circuits on a mixed-signal CMOS process. It will be obvious, however, to one skilled in the art, that the present invention may be practiced without some or all of these specific details. In other instances, well known process operations have not been described in detail in order not to unnecessarily obscure the present invention.

One approach to improve the transistor analog performance is through modified circuit designs exploiting the benefits of selective forward biasing of transistors. When the body-source junction of a transistor is forward biased, the threshold voltage of the transistor is reduced. The voltage of the body-source junction needs to be smaller than the diode turn-on voltage of the body-source junction, which is about 0.5V. Providing a positive voltage, for an n-type metal oxide semiconductor (NMOS) transistor, to the body terminal of the transistor reduces the depletion region into the channel from the source and the drain. Reduction of the depletion region from the source and drain of the transistor lowers the threshold voltage and the threshold voltage dependence on shared channel charge. Conversely, providing a reverse body bias to the body-source junction of a transistor increases the threshold voltage. Furthermore, forward biasing the body-source junction of the transistor decreases the output conductance of the transistor by reducing the drain induced barrier lowering of the transistor.

Figure 1:
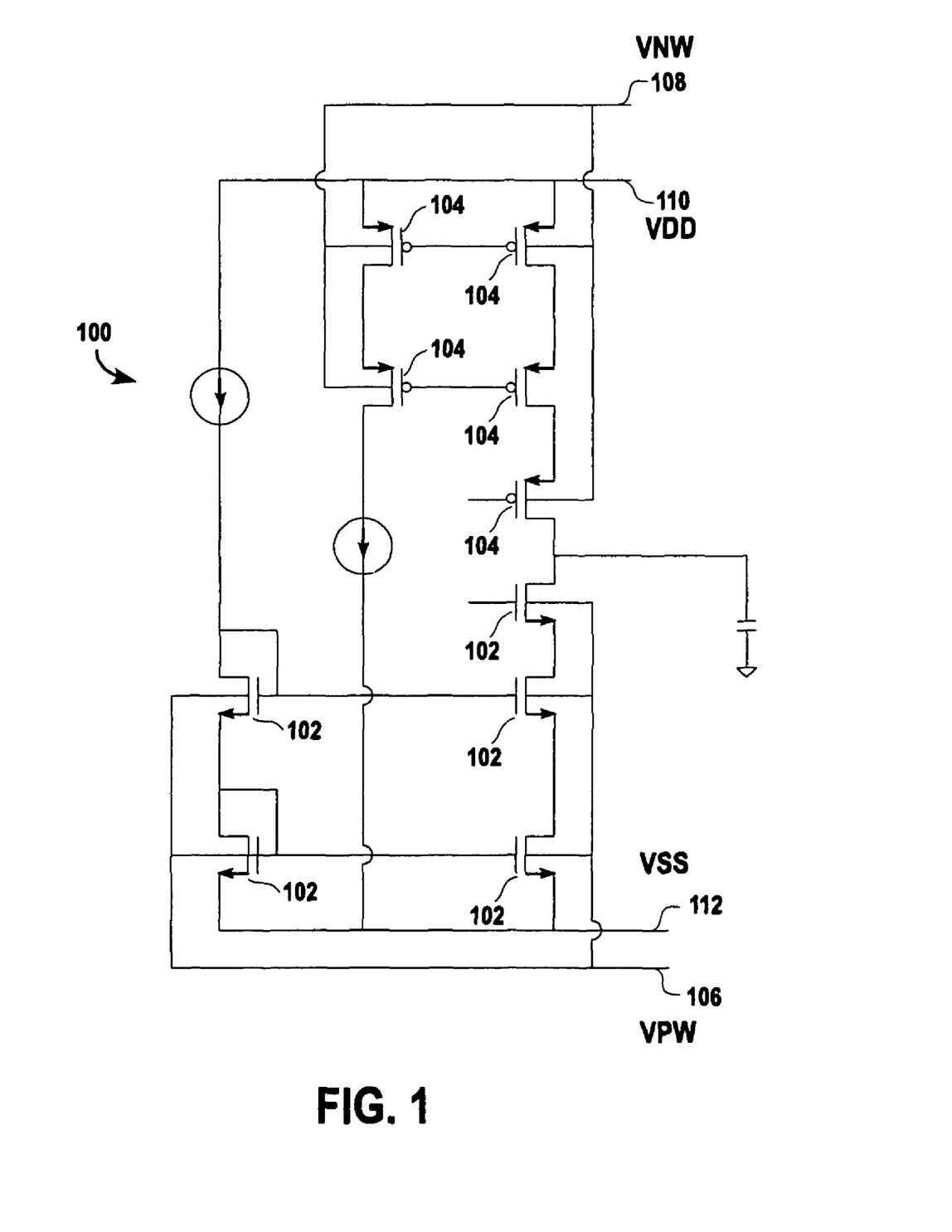
FIG. 1 illustrates an exemplary modified cascode circuit configured to accept modifiable voltages on the body terminals of the NMOS transistors and PMOS transistors in accordance with one embodiment of the present invention.

FIG. 1 illustrates an exemplary modified cascode circuit 100 configured to accept modifiable voltages on the body terminals of the NMOS transistors 102 and p-type metal oxide semiconductor (PMOS) transistors 104 in accordance with one embodiment of the present invention. While a specific modified cascode circuit is presented, the application is not limited to any particular circuit implementation. The modified cascode circuit 100 design allows selective application of forward bias to the body terminals of the transistors 102 and 104. The body terminals of the NMOS transistors 102 of the modified cascode circuit 100 are coupled to a first voltage source 106 VPW. The body terminals of the PMOS transistors 104 are coupled to a second voltage source 108 VNW. Power and ground are provided to the circuit through VDD 110 and VSS 112, respectively.

The first voltage source 106 and the second voltage source 108 are modifiable to provide a range of voltages, including forward and reverse bias to the body terminal of each of the NMOS transistors 102 and PMOS transistors 104, respectively. In addition to improved analog circuit performance when the body terminals of the transistors 102 and 104 are forward biased, the first voltage source 106 and the second voltage source 108 can be used in power saving mode. In power saving mode, the voltage sources 106 and 108 are modified to provide reverse bias to the body terminal of each of the transistors 102 and 104, which disables the circuit 100 when the circuit 100 is not being used. In one embodiment, the modified cascode circuit of FIG. 1 can be used as part of any mixed signal circuit, such as high speed transceivers, high speed serial interfaces, etc. One skilled in the art will appreciate that the voltage sources 106 and 108 may be generated off chip through an external voltage source or on chip through internal voltage sources.

Figure 2:
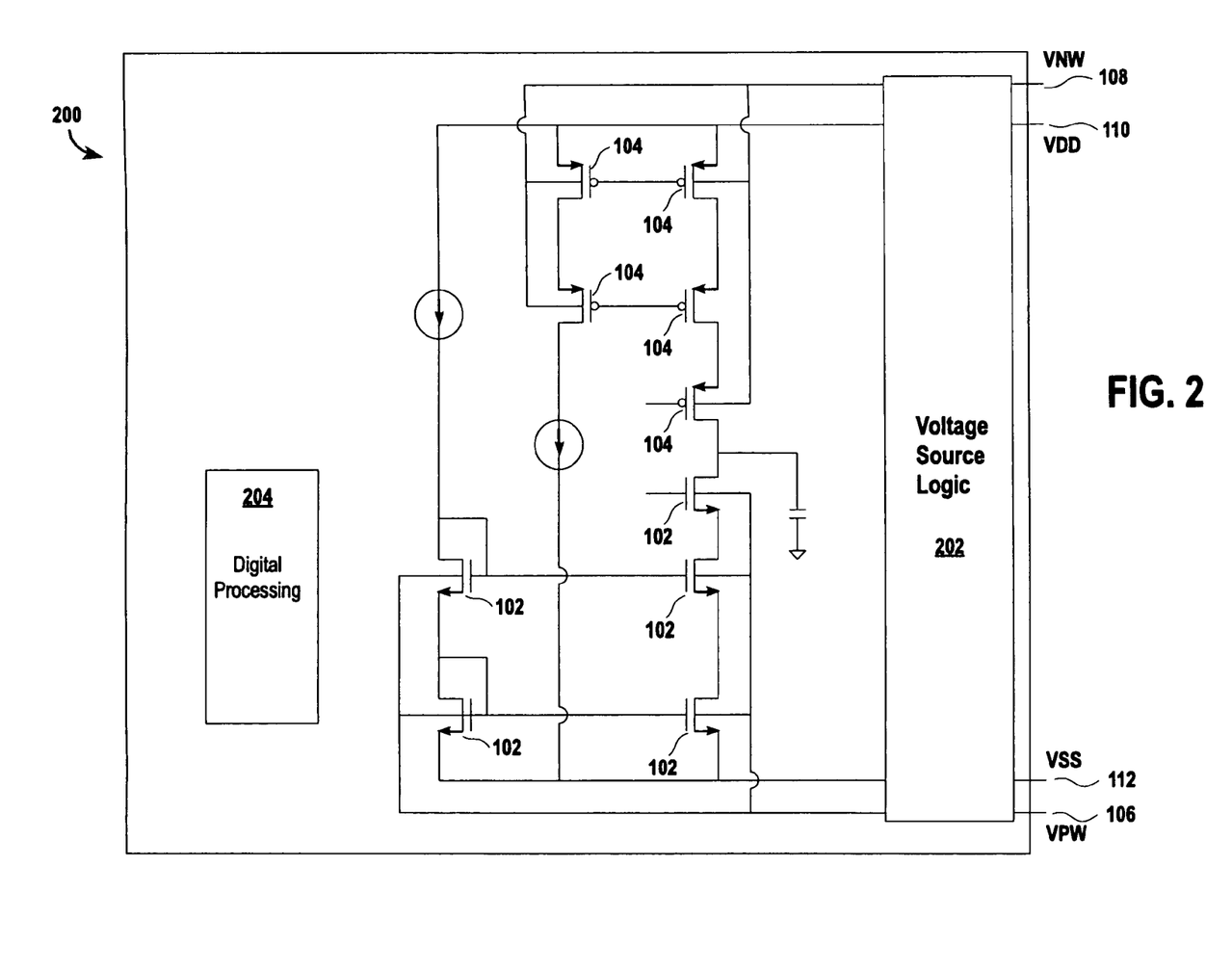
FIG. 2 illustrates the modified cascode circuit of FIG. 1 integrated with a voltage source logic in accordance with one embodiment of the present invention.

FIG. 2 illustrates the modified cascode circuit of FIG. 1 integrated with a voltage source logic 202 in accordance with one embodiment of the present invention. In one embodiment, the modified cascode circuit of FIG. 1 integrated with the voltage source logic 202 is capable of selectively applying a forward bias the body terminal of the plurality of transistors 102 and 104. In addition, the voltage source logic 202 is capable of modifying the first voltage source 106 (VPW) and the second voltage source 108 (VNW) to provide forward and reverse bias to the body terminal of the transistors 102 and 104.

The voltage source logic 202 receives the first voltage source 106, the second voltage source 108, VDD 110 and VSS 112. In addition, the voltage source logic 202 is capable of selecting transistors from the set of NMOS transistors 102 and from the set of PMOS transistors 104. In one embodiment, the first voltage source 106 and the second voltage source 108 are integrated into the voltage source logic 202, i.e. internal to the chip. Each body terminal of the NMOS transistors 102 and the PMOS transistors 104 selected by the voltage source logic 202 receives the first voltage source 106 and the second voltage source 108, respectively. Depending on the setting of the voltage source logic 202, the first voltage source 106 and the second voltage source 108 provides a forward bias voltage to the body terminal of each of the selected NMOS transistors 104 and PMOS transistors 104. Furthermore, the voltage source logic 202 can enable a power saving mode and disable selected transistors 102 and 104 by modifying the first voltage source 106 and the second voltage source 108 to provide reverse bias voltage to the body terminal of the selected NMOS transistors 102 and PMOS transistors 104. Disabling the circuit 200 saves power by turning off transistors 102 and 104 so that the transistors 102 and 104 will not draw current from the voltage sources 106 and 108 when the transistors 102 and 104 are not in operation.

One skilled in the art will appreciate that certain analog circuits, such as current mirrors, require close matching between groups of transistors. The embodiments described herein provide for the voltage source logic 202 to offset threshold voltage mismatches between individual or subsets of transistors 102 and 104. In one embodiment, the voltage source logic 202 selects a first subset of NMOS transistors 102 to match a threshold voltage of a second subset of NMOS transistors 102. The voltage source logic is capable of providing either forward bias or reverse bias voltage in the amount needed to match the threshold voltage of the first subset of NMOS transistors 102 to the threshold voltage of the second subset of NMOS transistors 102 by modifying the first voltage source 106 (VPW). In one embodiment, for mixed signal CMOS technology, the threshold voltage of a transistor decreases by approximately 20 mV for every 100 mV of forward bias voltage. The voltage source logic 202 can also compensate for threshold voltage mismatches between a first subset of PMOS transistors 104 and a second subset of PMOS transistors 104 using the second voltage source 108 (VNW). The voltage source logic 202 can modify the level of the second voltage source 108 (VNW) to provide forward bias voltage to the body terminal of the first subset of PMOS transistors 104 to match the threshold voltage of the second subset of PMOS transistors 104.

In one embodiment, the voltage source logic 202 can be implemented through the logic of a field-programmable gate array (FPGA) or a programmable logic device (PLD). In another embodiment, the voltage source logic 202 includes a number of switches for coupling the body terminal of each NMOS transistor 102 to the first voltage source 106 and the body terminal of each PMOS transistor 104 to the second voltage source 108. The switches may be implemented using passgates, which are activated by the voltage source logic 202. One skilled in the art will appreciate that for a PLD, the configuration can activate certain pass-gates to enable a desired routing of the voltage to the body terminals of the appropriate transistors. In a third embodiment, the voltage source logic 202 internally generates the voltages for the voltage sources 106 and 108 to the appropriate transistors 102 and 104 using the VDD 110 and VSS 112. The voltage source logic 202 can implement any method well known in the art, e.g. voltage regulators, to step down the voltage of VDD 110 or step up the voltage of VSS 112 to generate the appropriate forward or reverse bias voltage for the voltage sources 106 and 108, such as a voltage regulator.

In another embodiment, the logic selecting the subsets of transistors 102 and 104 receiving the voltage sources 106 and 108 can be implemented outside the voltage source logic 202. An input to the voltage source logic 202 can enable desired routing of the voltage to the body terminals of the appropriate transistors. While specific embodiments of the voltage source logic are presented, other embodiments can be envisioned so long as the essential function of supplying the modifiable voltages 106 and 108 to the body terminal of each of the selected transistors 102 and 104 is maintained. In yet another embodiment, the modified cascode circuit integrated with the voltage source logic 202 may be part of a mixed-signal integrated circuit containing digital processing 204. One skilled in the art would appreciate the circuit 200 can be a PLD or a FPGA, however this is not meant to be limiting as the embodiments can be applied to any suitable integrated circuit.

Figure 3:
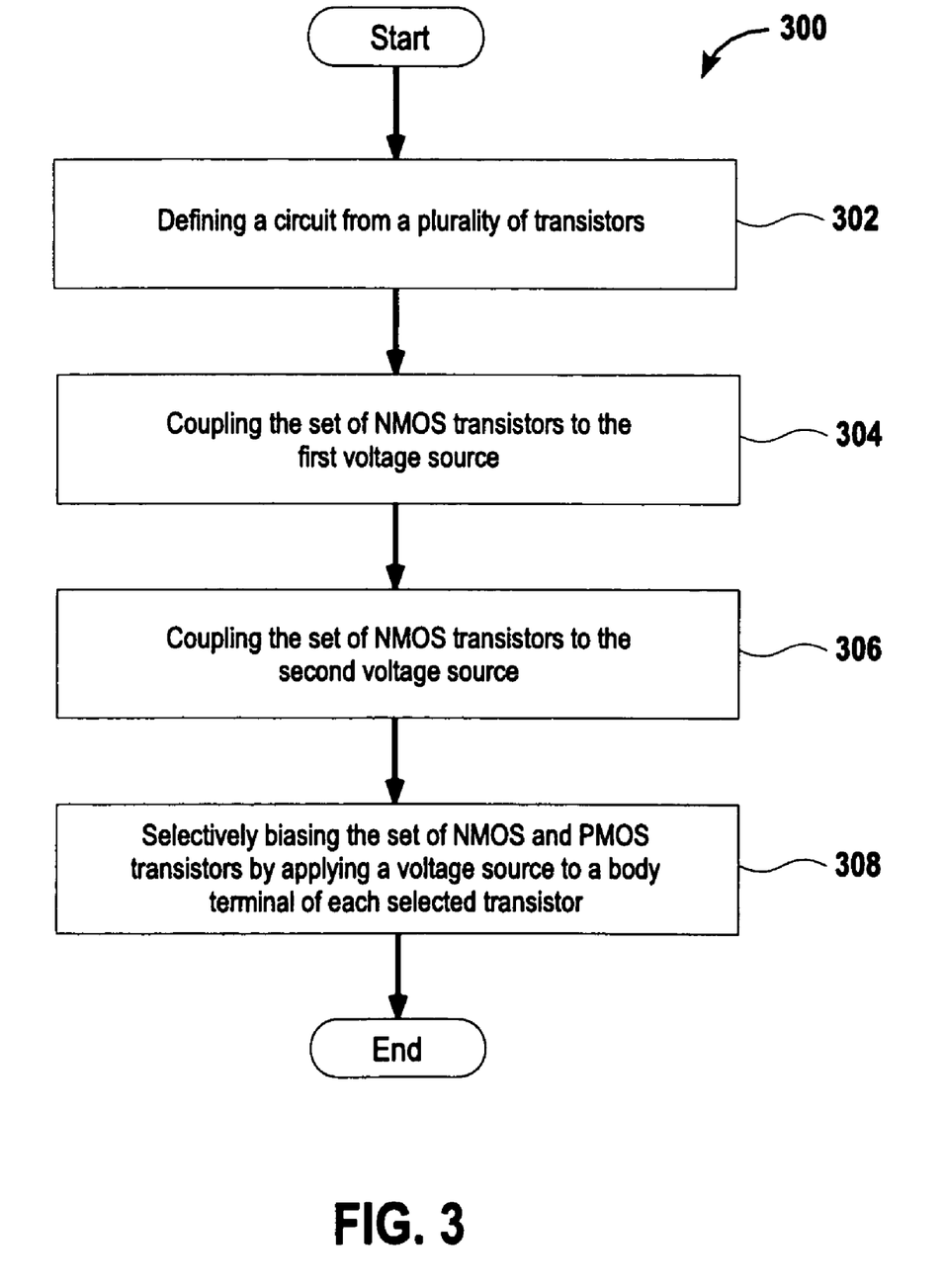
FIG. 3 is a flow chart diagram illustrating method operations for increasing gate overdrive headroom for analog circuits in accordance with one embodiment of the present invention.

FIG. 3 is a flow chart diagram 300 illustrating method operations for increasing gate overdrive headroom for analog circuits in accordance with one embodiment of the present invention. The method begins in operation 302 where an analog circuit, such as the modified cascode circuit in FIG. 2, is defined. In operation 304, the body terminal of each of the NMOS transistors is coupled to a first voltage source. The method then advances to operation 306 where the body terminal of each of the PMOS transistors is coupled to a second voltage source as illustrated in FIG. 1. In one embodiment, the first voltage source can be modified to provide a voltage between 0 and 0.4V and the second voltage source can be modified to provide a voltage between VDD and VDD −0.4V. The voltage ranges for the first voltage source and the second voltage source are for illustrative purposes and are not meant to limiting.

Operation 308 of FIG. 3 selectively biases the set of NMOS transistors by applying the first voltage source to a body terminal of each selected NMOS transistor and the set of PMOS transistors by applying the second voltage source to a body terminal of each selected PMOS transistor. The voltage source logic is capable of selecting a specific group of transistors for biasing. The first voltage source and the second voltage source provide forward bias to each body terminal of the selected transistors. The selected transistors range from each of the transistors in the circuit to an individual transistor. In one embodiment, the first voltage source and the second voltage source can be connected to each transistor in the circuit through a network of switches in the voltage source logic. The voltage source logic can use an address decoding logic to turn on switches in the network, thus selectively providing the first voltage source and the second voltage source to the body terminal of the selected transistors.

The voltage source logic can provide forward bias voltage to the transistors of the circuit of FIG. 2 to reduce the threshold voltage of the transistors, as well as improve the analog performance of the circuit. Alternately, the voltage source logic can disable the analog circuit by setting the first voltage source and second voltage source to provide reverse bias to each of the body terminal of each selected NMOS and PMOS transistors.

Figure 4:
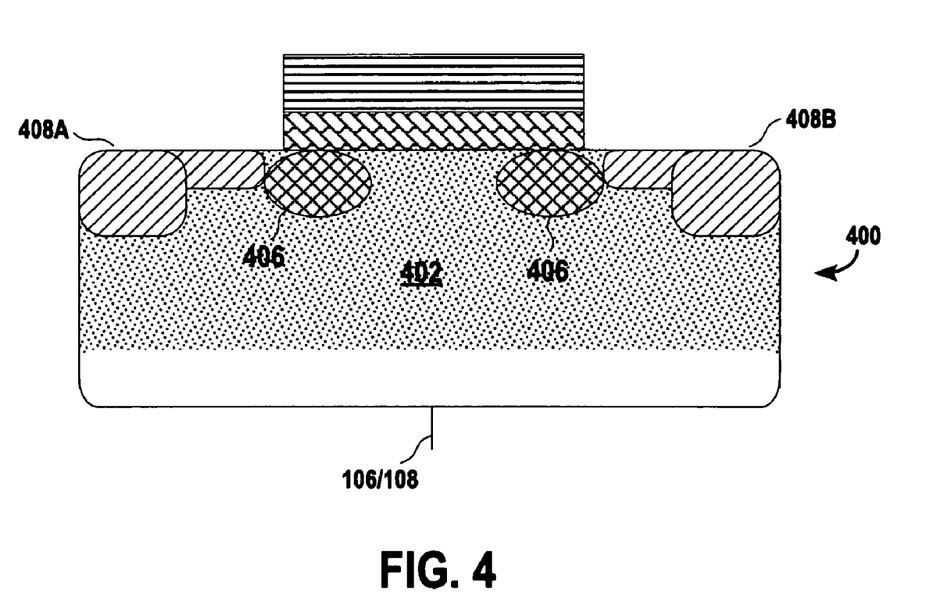
FIG. 4 illustrates a cross sectional view of a transistor designed to reduce mismatch through the use of forward biasing in accordance with one embodiment of the present invention.

An alternative approach to improving analog circuit performance combines the method of FIG. 3 with a modified mixed signal process technology. FIG. 4 illustrates a cross sectional view of a transistor 400 designed to reduce mismatch through the use of forward biasing in accordance with one embodiment of the present invention. The design of the transistor 400 roughly balances the pocket implant doping level 406 and channel doping levels 402. The channel of the transistor 400 has a doped retrograde well 402. In one embodiment, the doping level of the retrograde well approximately ranges from $1 \times 10^{17}$ cm$^{-3}$ to $1 \times 10^{18}$ cm$^{-3}$. In another embodiment, the transistor 400 has a pocket implant 406 near the source 404A and the drain 404B. One skilled in the art will appreciate the doping levels of the source 404A and the drain 404B are appropriate for a conventional CMOS process. The doping level of the pocket implant 406 is comparable to the doping level of the retrograde well 402 and approximately ranges from $5 \times 10^{17}$ cm$^{-3}$ to $5 \times 10^{18}$ cm$^{-3}$. In other words, the relative ratio of the pocket implant 406 doping level to the doping level of the channel retrograde well 402 should be approximately a factor of five. The doping levels for the pocket implant 406, the retrograde well 402, and relative doping ratio of the pocket implant 406 to the channel doping 402, are for illustrative purposes and are not meant to limiting. One of ordinary skill in the art will appreciate the transistor 400 of FIG. 4 can be either a NMOS or PMOS transistor with the appropriate voltage applied to the body terminal 106/108 of the transistor.

Employing the uniform highly-doped retrograde well doping with comparable pocket doping levels reduces the short channel effects of the transistor 400 without increasing transistor threshold voltage mismatch or output conductance. One of ordinary skill in the art can appreciate that transistor 400 can optionally have sidewall spacers on opposite sides of the gate oxide and the gate contact.

Figure 5:
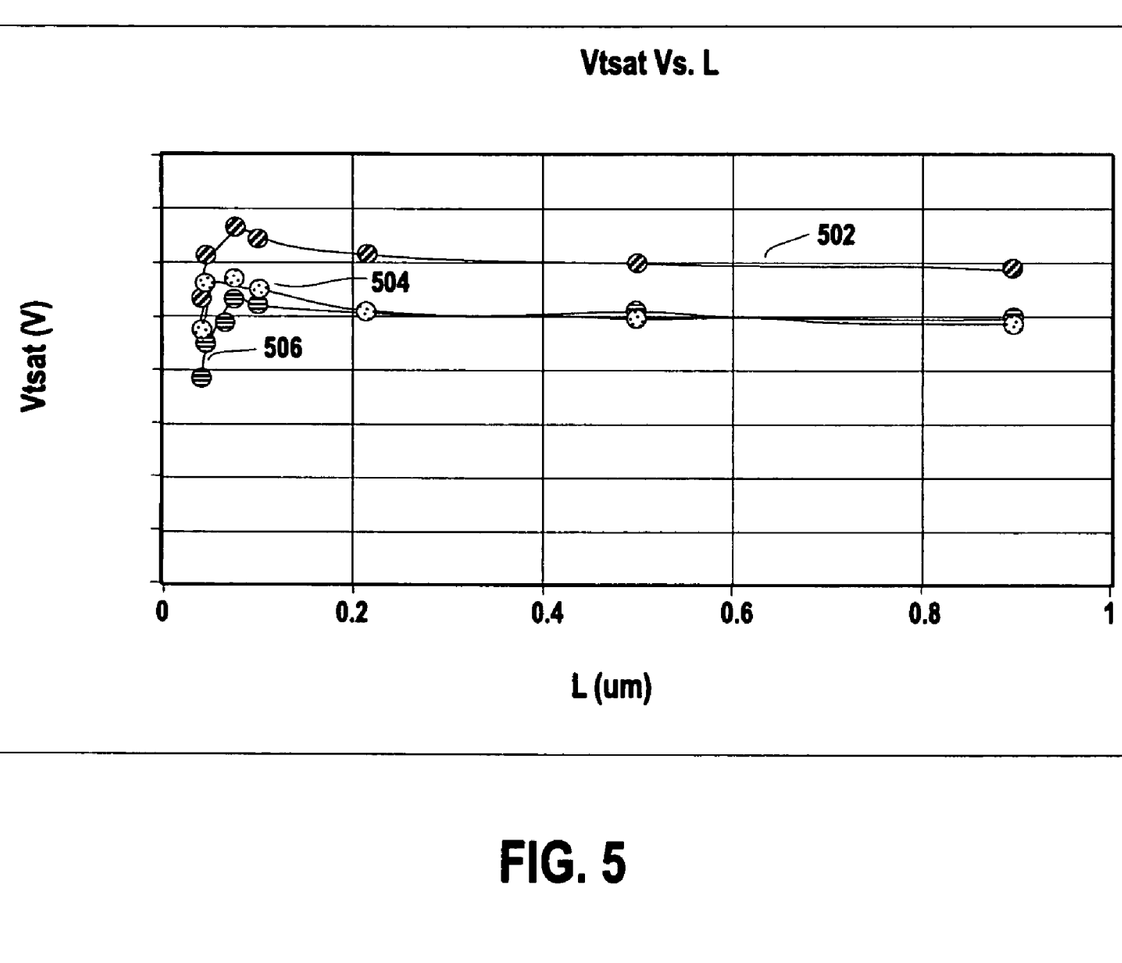
FIG. 5 is a graph illustrating exemplary simulated transistor threshold voltage values as a function of channel length in accordance with one embodiment of the present invention.

FIG. 5 is a graph illustrating exemplary simulated transistor threshold voltage values as a function of channel length, in accordance with one embodiment of the present invention. The transistor of FIG. 4 with a uniform-doped retrograde well has a simulated threshold voltage as a function of gate length shown by line 502 of FIG. 5. By applying forward bias to the body terminal of the transistor, the transistor threshold voltage for the transistor of FIG. 4 has a simulated threshold voltage as a function of gate length illustrated by line 506 of FIG. 5. The simulated transistor threshold voltage as a function of gate length curve for a transistor processed using a standard mixed-signal CMOS process and without forward biasing is provided as a reference line 504 of FIG. 5.

The embodiments, thus far, are described with respect to PLDs. The method and apparatus described herein may be incorporated into any suitable circuit, including processors and PLDs. For example, the method and apparatus may be incorporated into other types of devices such as a programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be the PLDs manufactured by ALTERA CORPORATION.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for increasing gate overdrive headroom for analog circuits, comprising:
    defining a circuit from a plurality of transistors, the plurality of transistors including a set of NMOS and a set of PMOS transistors;
    coupling the set of NMOS transistors to a first voltage source;
    coupling the set of PMOS transistors to a second voltage source; and
    selectively biasing a portion of the set of NMOS transistors by applying the first voltage source to a body terminal of each selected NMOS transistor and selectively biasing a portion of the set of PMOS transistors by applying the second voltage source to a body terminal of each selected PMOS transistor, wherein the first and second voltage sources are modifiable to provide forward and reverse bias.

2. The method of claim 1, further comprising:
    supplying voltage to the plurality of transistors from the first voltage source and the second voltage source, and the supplied voltage forward biasing a body-source junction.

3. The method of claim 1, further comprising:
    doping a channel of each of the plurality of transistors with an uniform-doped retrograde well, and implanting a pocket implant near a source and a drain of each of the plurality of transistors, the pocket implant having a doping level less than an order of magnitude higher than a doping level of the channel of the corresponding transistor.

4. The method of claim 1, further comprising:
    forward biasing the body terminal of each of a first subset of the set of NMOS transistors using the first voltage source to match a threshold voltage of a second subset of the set of NMOS transistors.

5. The method of claim 1, further comprising:
    forward biasing the body terminal of each of a first subset of the set of PMOS transistors using the second voltage source to match a threshold voltage of a second subset of the set of PMOS transistors.

6. The method of claim 1, wherein the analog circuit is part of a mixed signal integrated circuit and wherein the first voltage source and the second voltage source are modifiable to disable the circuit by providing reverse bias to the body terminal of each of the plurality of transistors.

7. The method of claim 1, wherein the portion of the set of NMOS transistors and the portion of the set of PMOS transistors are selectively biased through a common voltage source, wherein the voltage source is implemented through configurable logic of the circuit.

8. A circuit for reducing transistor mismatch and increasing gate overdrive headroom, the circuit operated by a process comprising:
    combining a set of NMOS and a set of PMOS transistors to form a circuit;
    connecting the set of NMOS transistors to a first voltage source;
    connecting the set of PMOS transistors to a second voltage source; and
    selectively applying a bias to a portion of the set of NMOS transistors by providing the first voltage source to a body terminal of each NMOS transistor and selectively applying a bias to a portion of the set of PMOS transistors by providing the second voltage source to a body terminal of each PMOS transistor, wherein the first and second voltage sources are modifiable to provide forward and reverse bias.

9. The circuit of claim 8, further comprising:
    providing voltage to the plurality of transistors from the first voltage source and the second voltage source, and the provided voltage forward biasing a body-source junction.

10. The circuit of claim 8, further comprising:
    forward biasing the body terminal of each of a first subset of the set of NMOS transistors using the first voltage source to match a threshold voltage of a second subset of the set of NMOS transistors.

11. The circuit of claim 8, further comprising:
    forward biasing the body terminal of each of a first subset of the set of PMOS transistors using the second voltage source to match a threshold voltage of a second subset of the set of PMOS transistors.

12. The circuit of claim 8, wherein the analog circuit is part of a mixed signal integrated circuit and wherein the first voltage source and the second voltage source modifiable to disable the circuit by providing reverse bias to the body terminal of each of the plurality of transistors.

13. The circuit of claim 8, wherein the portion of the set of NMOS transistors and the portion of the set of PMOS transistors are selectively biased through a common voltage source, wherein the voltage source is implemented through configurable logic of the circuit.

14. A circuit for decreasing output conductance and transistor mismatch, comprising:
    a plurality of transistors, the plurality of transistors including a set of NMOS and a set of PMOS transistors, and a channel of each of the plurality of transistors having an uniform-doped retrograde well; and
    a first voltage source and a second voltage source, the first voltage source coupled to a body terminal of each of the set of NMOS transistors, the first voltage source modifiable to provide forward and reverse bias, the second voltage source coupled to a body terminal of each of the set of PMOS transistors, the second voltage source modifiable to provide forward and reverse bias, wherein the first voltage source and second voltage sources are modifiable to select a portion of transistors from one of the set of NMOS transistors or from the set of PMOS transistors.

15. The circuit of claim 14, further comprising: a voltage source logic to generate the first voltage source and the second voltage source, each of the selected NMOS transistors receiving the first voltage source to the body terminal, each of the selected PMOS transistors receiving the second voltage source to the body terminal.

16. The circuit of claim 14, wherein the plurality of transistors having a pocket implant near a source and a drain of each of the plurality of transistors, and the pocket implant has a doping level less than an order of magnitude higher than a doping level of the channel of the corresponding transistor.

17. The circuit of claim 14, wherein the voltage source logic supplies the first voltage source to the body terminal of each in a first subset of the set of NMOS transistors, the first voltage source providing a forward bias voltage to the body terminal of each in the first subset of the set of NMOS transistors to match a threshold voltage of a second subset of the set of NMOS transistors.

18. The circuit of claim 14, wherein the voltage source logic supplies the second voltage source to the body terminal of each in a first subset of the set of PMOS transistors, the second voltage source providing a forward bias voltage to the body terminal of each in the first subset of the set of PMOS transistors to match a threshold voltage of a second subset of the set of PMOS transistors.

* * * * *